(12) United States Patent
Vandeparre et al.

(10) Patent No.: US 9,826,625 B2
(45) Date of Patent: Nov. 21, 2017

(54) STRETCHABLE ELECTRONIC STRUCTURES FORMED OF THIN FILMS INTEGRATED WITH SOFT HETEROGENEOUS SUBSTRATE

(71) Applicant: ECOLE POLYTECHNIQUE FEDERALE DE LAUSANNE (EPFL), Lausanne (CH)

(72) Inventors: Hugues Vandeparre, Petit-Enghien (BE); Stephanie Lacour, Daillens (CH)

(73) Assignee: Ecole Polytechnique Federale de Lausanne (EPFL), Lausanne (CH)

( * ) Notice: Subject to any disclaimer, the term of this patent is extended or adjusted under 35 U.S.C. 154(b) by 0 days.

(21) Appl. No.: 14/406,346

(22) PCT Filed: Jun. 10, 2013

(86) PCT No.: PCT/IB2013/054754
§ 371 (c)(1),
(2) Date: Dec. 8, 2014

(87) PCT Pub. No.: WO2013/186693
PCT Pub. Date: Dec. 19, 2013

(65) Prior Publication Data
US 2015/0143925 A1    May 28, 2015

(30) Foreign Application Priority Data
Jun. 11, 2012  (WO) .................. PCT/IB2012/052946

(51) Int. Cl.
*G01L 1/00* (2006.01)
*H05K 1/00* (2006.01)
(Continued)

(52) U.S. Cl.
CPC ............ *H05K 1/0271* (2013.01); *G01L 1/142* (2013.01); *H05K 1/0373* (2013.01); *H05K 1/09* (2013.01);
(Continued)

(58) Field of Classification Search
CPC ............ G01L 1/142; H03K 2017/9602; Y10T 29/49117; H05K 1/0271; H05K 1/0373; H05K 1/09; H05K 2201/0116
(Continued)

(56) References Cited

U.S. PATENT DOCUMENTS

2010/0330338 A1* 12/2010 Boyce .................... B29C 59/02
428/156

FOREIGN PATENT DOCUMENTS

DE    102009055121    6/2011
WO    WO 2011/008459    1/2011

OTHER PUBLICATIONS

Cotton et al.: "A Multifunctional Capacitive Sensor for Stretchable Electronic Skins", IEEE Sensors Journal, IEEE Service Center, New York, NY, US, vol. 9, No. 12, Dec. 1, 2009 (Dec. 1, 2009), pp. 2008-2009, XP011279348.
(Continued)

*Primary Examiner* — Harshad R Patel
*Assistant Examiner* — Brandi Hopkins
(74) *Attorney, Agent, or Firm* — Sheridan Ross P.C.

(57) ABSTRACT

Stretchable electronic structure comprising one intrinsically fragile thin film integrated on or within a soft heterogeneous substrate. The invention also relates to a process for manufacturing such a structure.

16 Claims, 21 Drawing Sheets

(51) Int. Cl.
    H05K 1/02      (2006.01)
    G01L 1/14      (2006.01)
    H05K 1/03      (2006.01)
    H05K 1/09      (2006.01)
    H03K 17/96     (2006.01)
(52) U.S. Cl.
    CPC ........... H03K 2017/9602 (2013.01); H05K 2201/0116 (2013.01); Y10T 29/49117 (2015.01)
(58) Field of Classification Search
    USPC .................................. 73/862.626
    See application file for complete search history.

(56) References Cited

OTHER PUBLICATIONS

Graz Ingrid et al: "Silicone substrate with in situ strain relief for stretchable thin-film transistors", Applied Physics Letters, AIP, American Institute of Physics, Melville, NY, US, vol. 98, No. 12, Mar. 22, 2011 (Mar. 22, 2011), pp. 124101-124101, XPO12139862.

Lacour Stephanie Perichon et al.: "Stretchable gold conductors on elastomeric substrates", Applied Physics Letters, AIP, American Institute of Physics, Melville, NY, US, vol. 82, No. 15, Apr. 14, 2003 (Apr. 14, 2003), pp. 2404-2406, XP012033744.

International Search Report and Written Opinion prepared by the European Patent Office dated Nov. 21, 2013, for International Application No. PCT/IB2013/054754.

Dunne et al., "Initial development and testing of a novel foam-based pressure sensor for wearable sensing," Journal of Neurcepoineering and Rehabilitation, 2005, vol. 2(4), 7 pages.

Graz et al, "Flexible ferroelectret field-effect transistor for large-area sensor skins and microphones," Applied Physics Letters, American Institute of Physics, 2006, vol. 89(7), pp. 73501-1-73501-3.

Metzger et al., "Flexible-foam-based capacitive sensor arrays for object detection at law cost," Applied Physics Letters, American Institute of Physics, 2008, vol. 92(1), pp. 13506-1-13506-3.

Kim et al., "Ultra-sensitive Flexible Pressure Sensor with Stamped Polyurethane Rubber," 2011 11th IEEE Conference on Nanotechnolo9y, 2011, pp. 1607-1610.

Official Action for European Patent Application No. 122747501.8, dated Feb. 6, 2017, 9 pages.

\* cited by examiner

Figure 2a
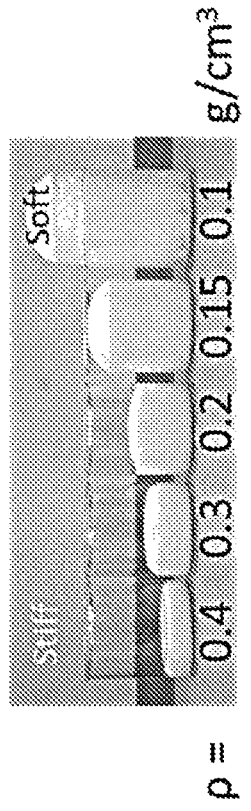
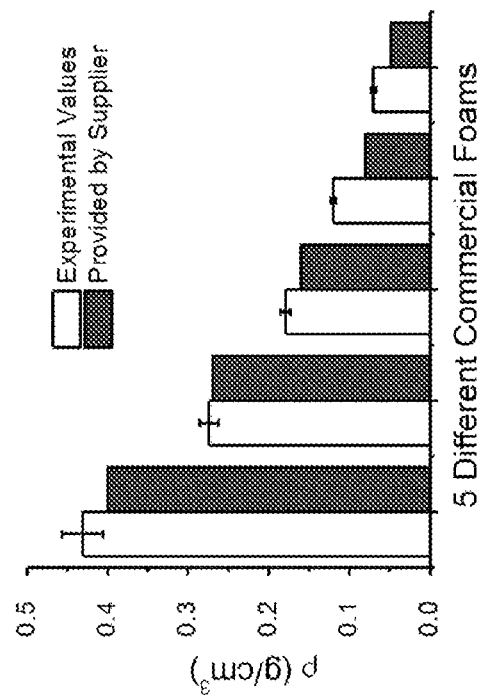

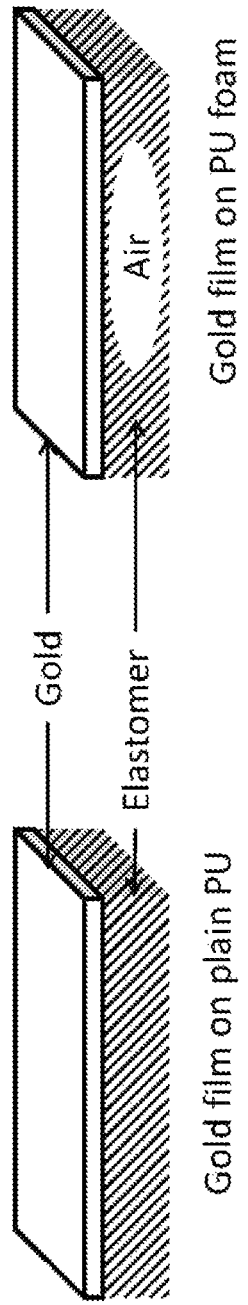

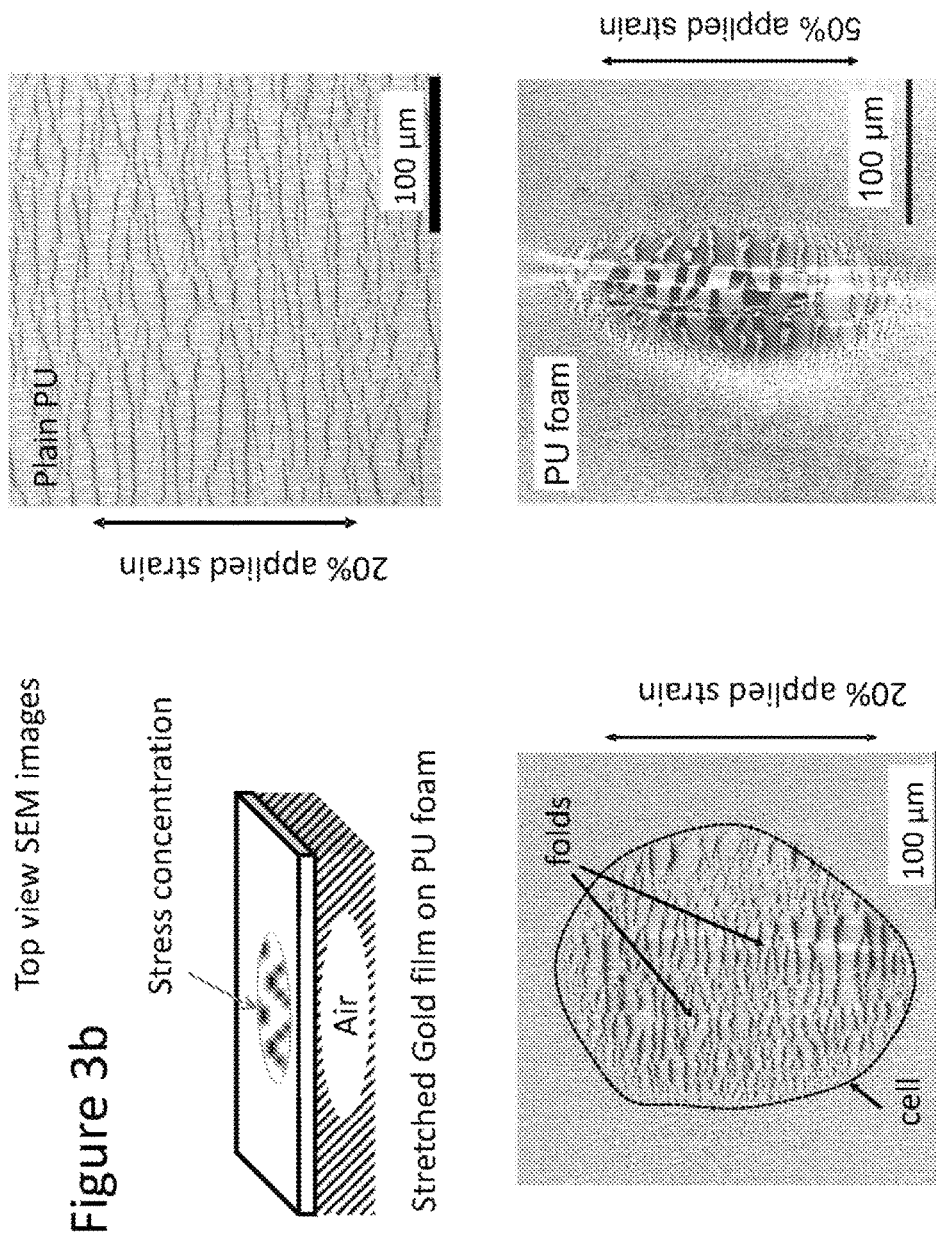

Local strain in the gold film above a cellular PU foam substrate and above plain PU elastomer when the structure is stretched by 20% strain. The strain is derived from the local density of cracks and plotted in the direction normal to the applied strain.

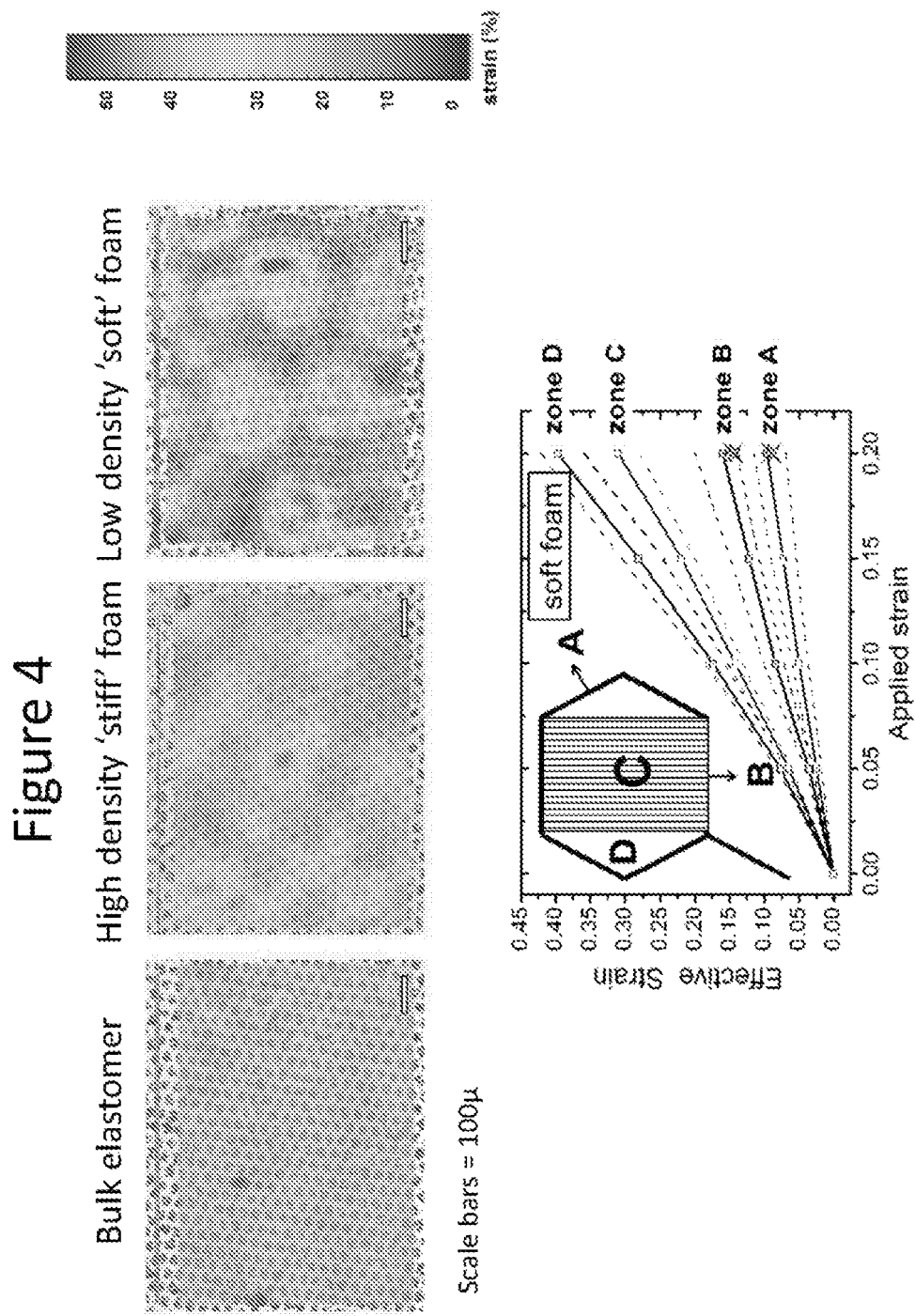

Scale bars = 5mm

STRETCHABLE ELECTRONIC STRUCTURES FORMED OF THIN FILMS INTEGRATED WITH SOFT HETEROGENEOUS SUBSTRATE

CROSS REFERENCE TO RELATED APPLICATIONS

This application is a national stage application under 35 U.S.C. 371 and claims the benefit of PCT Application No. PCT/IB2013/054754 having an international filing date of Jun. 10, 2013, which designated the United States, which PCT application claimed the benefit of International Application No. PCT/IB2012/052946 filed Jun. 11, 2012, the disclosure of each of which are incorporated herein by reference.

FIELD OF INVENTION

The invention relates to stretchable electronic structures integrated on or within an elastic substrate.

GENERAL DESCRIPTION OF THE INVENTION

The invention is a stretchable electronic structure comprising an intrinsically fragile thin film integrated on or within a soft heterogeneous substrate. By doing so, one can tailor the mechanical properties of the thin film(s) without compromising on its (their) electrical properties.

The <<thin film>> is defined as a material of a maximum thickness of 1 μm. The term <<fragile>> associated with <<thin film>> refers to either ductile (e.g. metal) or brittle (e.g. silicon) materials, which cannot sustain reversibly large mechanical elongation without cracking.

The expression <<soft heterogeneous substrate>> has to be understood as having more than one constituent or phase, thus exhibiting different properties in different portions.

Preferably, but not exclusively, the soft heterogeneous substrate according to the invention is defined as a multi-phase mixture comprising at least two portions, with one being an elastic matrix (e.g. a rubbery material) and the other one being a mechanically softer domain (e.g a softer elastomer, a gel or air). The soft domains are distributed within the matrix in a random or organized manner, with a high or low density and can have an initial isotropic or anisotropic shape.

Concept

A homogeneous substrate deforms uniformly upon mechanical loading; the resulting strain at any point within and on the surfaces of the substrate is identical. When the same mechanical loading is applied to a heterogeneous substrate, the macroscopic deformation is distributed across the different portions resulting in distinct, localized strains within the substrate and its surfaces. Soft domains will deform more than the stiffer ones.

To illustrate the invention let us consider a substrate possessing two domains, a domain A surrounded by a continuous domain B, domain B being stiffer than domain A (FIG. 1a). For clarity, let us develop an oversimplified mechanical model describing such heterogeneous substrate under mechanical loading. As shown FIG. 1b, this model is based on an assembly of springs in series, with $k_A$ and $k_B$ the spring constants of domains A and B respectively, and $k_A < k_B$. Under stretching, the springs with the smallest spring constant, i.e. $k_A$, absorb most of the deformation. The relation between the resulting displacements $x_A$ and $x_B$, for domains A and B respectively, is expressed as $x_A = x_B(k_B/k_A)$.

If we now bond on top of the heterogeneous substrate a fragile thin film, which is considerably thinner than the substrate, the strain across the thin film will follow the deformation imposed by the substrate. As a result, a symmetry breaking of the stress field occurs in the fragile, uniform, thin film material. The film immediately above the soft domains of the substrate sustains substantial deformation while the rest of the film (bonded to the stiffer domains of the substrate) deforms little, and in an extreme case, not at all (FIG. 1c).

Materials

In a preferred embodiment, as described above, the heterogeneous substrate can be made of any material(s) observing to the following condition: a soft multi-domain material where the domains are defined by highly contrasted stiffness. Such substrates include engineering materials such as foams, photo-patternable materials, engineered multilayers (prepared and patterned using lithography, printing or molding techniques), composite materials, polymers or natural materials such as wood.

The coating materials, i.e. fragile thin films, include electronic device materials such as inorganic conducting materials (e.g. metals, metal oxides), inorganic semiconducting materials (e.g. silicon, germanium, metal oxides), organic conducting materials (e.g. PEDOT, polyanylline, graphene), organic semiconducting materials (e.g. conjugated polymers, small molecules), and dielectric materials (e.g. inorganic nitrides and oxides, plastics).

DETAILED DESCRIPTION OF THE INVENTION

The invention will be better understood below, with examples and figures.

Figure 1A:
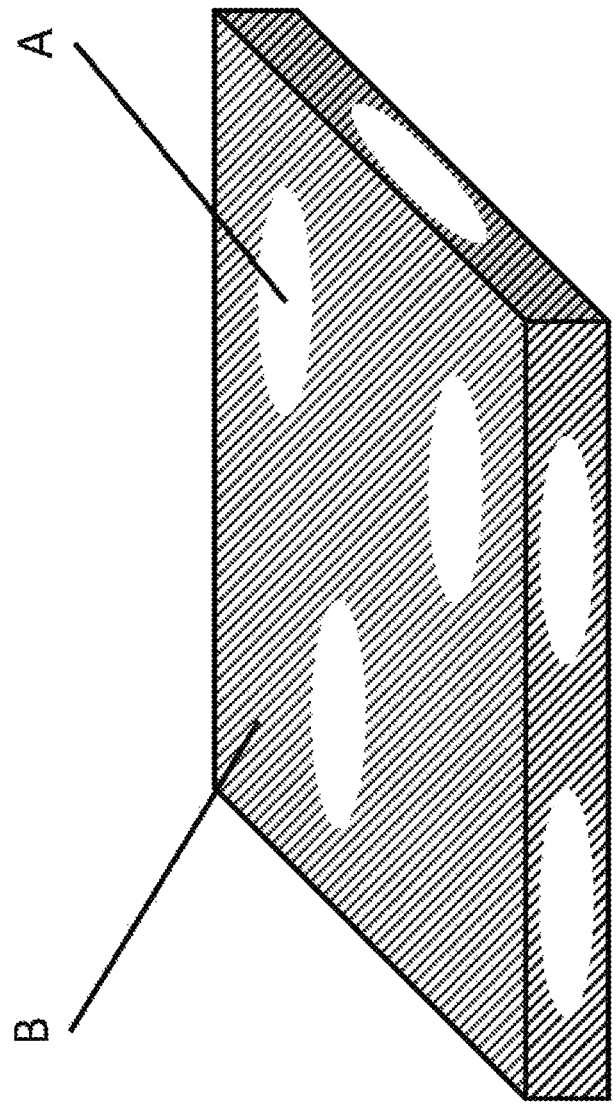
FIG. 1. Thin film on heterogeneous substrate
a. Schematic view of a heterogeneous material formed of two domains: the soft domains (white patterns) are embedded and distributed within a stiffer domain (hatched volume).
b. Spring mechanical model of the heterogeneous substrate. The soft and stiff domains are characterized by spring constant. Upon macroscopic stretching, the soft domains more than the stiff domains.
c. Tensile loading is applied across the uniform thin film (white) bonded onto the heterogeneous substrate. Strain larger than the applied, macroscopic strain develops within the soft domains as well as the thin film immediately above the soft domains.
Figure 1B:
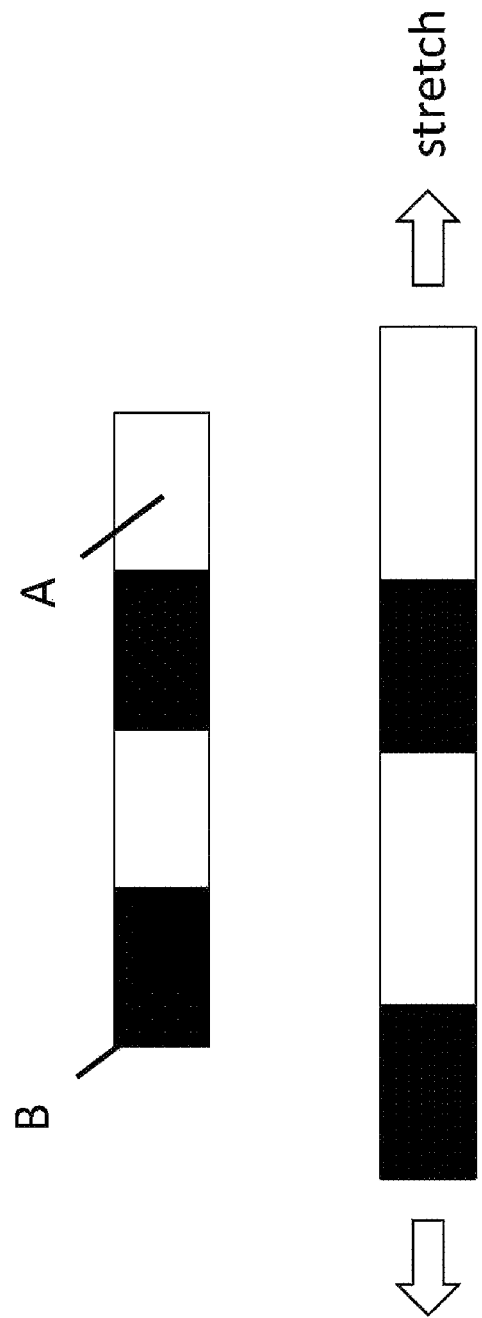
Figure 1C:
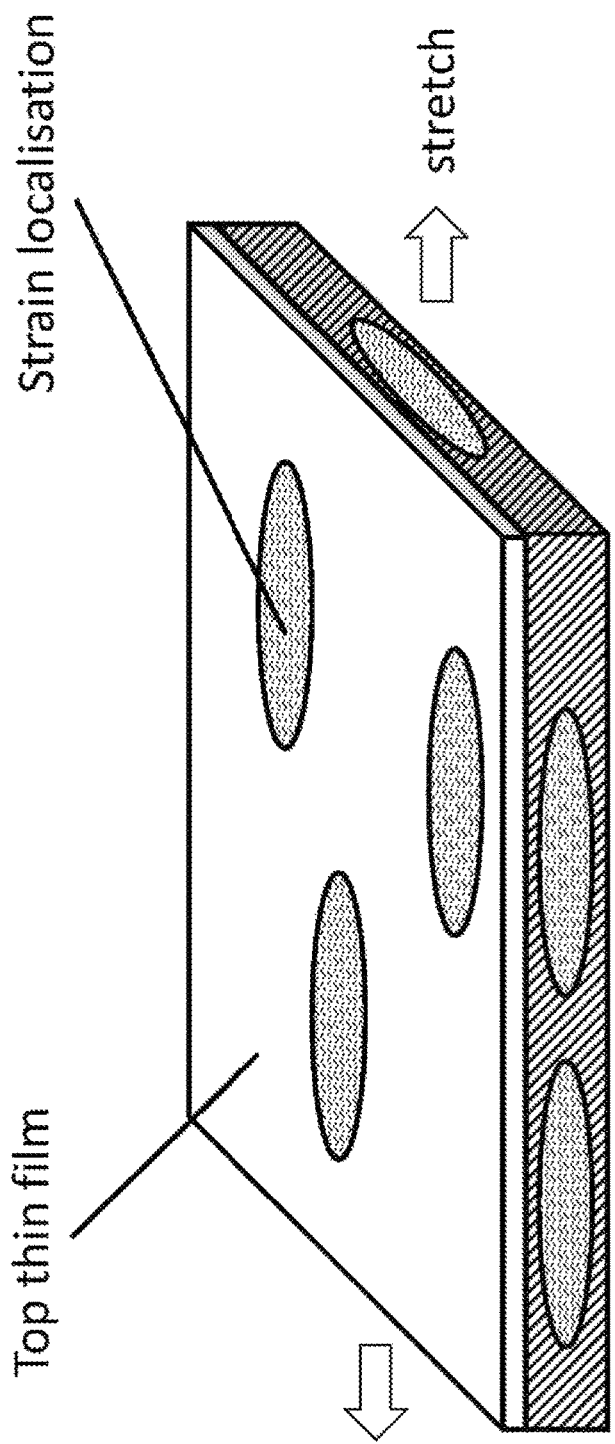

c. Micro Computed Tomography (μCT) scans of stiff ($\rho=0.4$ g·cm$^{-3}$) and soft ($\rho=0.1$ g·cm$^{-3}$) PU foams; scale bar: 1 mm.

d. Stress-strain curves of stiff ($\rho=0.4$ g·cm$^{-3}$) and soft ($\rho=0.1$ g·cm$^{-3}$) FPF substrates under compressive loading. The curves show the typical three-deformation regimes of open-cell PU foams: linear elastic, plateau and densification. Inset: close-up on the linear elastic response of the light foam.

e. Stress-strain curves of plain PU ($\rho=1.2$ g·cm$^{-3}$), stiff ($\rho=0.4$ g·cm$^{-3}$) and soft ($\rho=0.1$ g·cm$^{-3}$) FPF substrates under tensile loading.

FIG. 3. Topography and microstructure of thin gold films evaporated on PU foam a. Schematic representation of a thin metal film coating a plain PU and a foam PU substrate.

b. Scanning electron micrographs of the 25 nm thick film on plain PU ($\rho=1.2$ g·cm$^{-3}$), and an open-cell PU foam ($\rho=0.1$ g/cm$^3$) at uni-axial stretch to 20% (bottom left) and 50% (bottom right) strain.

c. Local strain in the gold film above a bubble when the structure is stretched by 20% strain. The strain is derived using Differential Interference Contrast Correlation microscopy. Scanning electron micrographs taken along the yellow line shown in 3b: the gold film away from the cell is covered with a dense network of microcracks (x); at the transition zone (y), microcracks merge to form microscopic cracks (z).

FIG. 4. Surface strain mapping.

Optical image and corresponding strain map measured at the surface of plain (bulk) PU ($\rho=1.2$ g·cm$^{-3}$), stiff ($\rho=0.4$ g·cm$^{-3}$) and soft ($\rho=0.1$ g·cm$^{-3}$) PU foam, stretched along the x-axis to an applied strain of 20%; scale bar: 100 μm. (bottom graph) Average strains experimentally determined in the four zones A to D at the surface of the soft foam as a function of the applied strain; the schematic illustrates each zone above one cell.

FIG. 5. Electromechanically response of metalized flexible polyurethane foam a. Relative electrical resistance as a function of applied strain of a 25 nm thick, 5 mm wide, 20 mm long gold film evaporated on 0.5 mm thick plain PU ($\rho=1.2$ g·cm$^{-3}$), stiff ($\rho=0.4$ g·cm$^{-3}$) and soft ($\rho=0.1$ g·cm$^{-3}$) PU foam; inset: all samples are stretched to large strains before failure.

b. Electrical resistance (recorded at 0% and 20% strain) as a function of number of stretching cycles to 20% strain. Conductors are 25 nm thick, 5 mm wide, 20 mm long.

c. Optical images of the fully compliant conductors on PU foams when the skin is stretched over three fingers (top), conforms a corrugated tube (middle), and is folded into a "hand fan" (bottom). scale bar: 5 mm.

d. Optical images of highly deformable foam based sensors. (top) FPF-based stretchable sensor array before, during, and after manual crumpling. Despite the extreme deformation involved, performance of the sensor is unaffected, and the gold coating remains intact. (bottom) indentation of the sensor on a pencil tip, showing the conformability of the array. The array is encapsulated on one side by 100 μm-thick reversibly-bonded PDMS.

FIG. 6. Capacitive pressure sensors a. Schematic cross-section of a capacitive sensor (top) and an example of a patterned array of capacitive sensors (bottom).

b. Change in capacitance (left) and foam dielectric constant (right) of a 1 cm$^2$ sensor prepared with soft foam as a function of applied normal compression.

c. the variation of capacitance as a function of applied compressive stress: under the same pressure, the softer foam compresses further and therefore its capacity increases higher. The slope of both curves increases in the range corresponding to their respective stress-strain d. FPF-based capacitive sensor response as a function of time during cyclic pressure applied normal to the sensor surface at a speed of 15 microns per seconds. (left) The applied pressure increases every 20 cycles from 1.3, 2.5, 4, 12 to 50 kPa. The electrodes surface area is 1 cm$^2$. (right) The applied pressure increases every 20 cycles from 130, 430, to 800 kPa. The flexible PU foam has a density of $\rho=0.33$ g·cm$^{-3}$. The electrodes surface area is 1 cm$^2$. (bottom) Sensor, prepared with soft foam, subjected to cyclic compression at three successive force levels of 10, 50, and 300 kPa.

Figure 7:
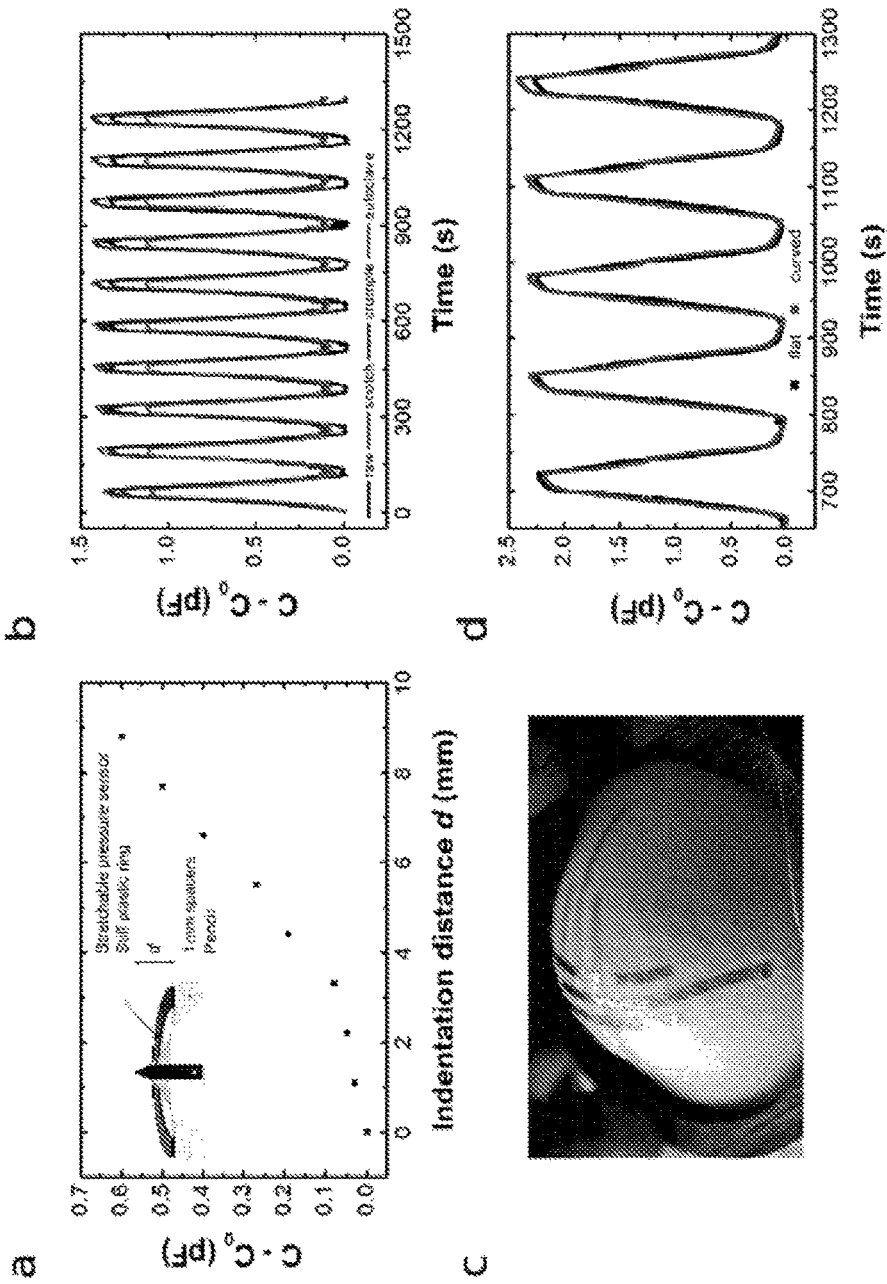

FIG. 7. Highly conformal capacitive pressure sensors. Response of the sensors when deformed and after durability testing.

a. Variation of the capacitance of a sensor on soft foam measured as the matrix is stretched over a pencil tip.

b. A soft-foam-based sensor is subjected to cyclic compressive strain up to 75% before and after durability tests. Neither the scotch tape test nor crumpling deteriorate performance. Autoclaving does modify the response, but does not cancel it.

c. Optical image of a 3×3 capacitive sensor matrix (FPF density: $\rho=0.1$ g·cm$^{-3}$) coated over a golf ball. Each sensor has a surface area of 4 mm$^2$.

d. When wrapped around a golf ball, the foam conforms to the dimples, and the sensors respond the same as a flat sensor when subjected to 75% compressive strain cycles

EXAMPLE: THIN GOLD FILM BONDED TO A POLYURETHANE FOAM

In this example the structure consists of a sub-100 nm thick gold thin films deposited by thermal evaporation on a sub-mm thick flexible polyurethane foam substrate.

Flexible polyurethane foams are interesting heterogeneous materials. They consist of two domains: polyurethane polymer PU (domain B) and gas, e.g. air or $CO_2$ (domain A). The mechanical mismatch between the bulk polyurethane polymer and the gas bubbles is huge. The substrate heterogeneity (gas bubbles in the polyurethane matrix) arises spontaneously during the polyurethane foam formation (the blowing agent is a product of the chemical reaction). The surface of the foam is smooth, and the cells are spontaneously covered with a thin layer of PU It is worth noting that flexible foams are industrially important materials with extensive use in household and hospital furniture, car seating, shock adsorption pads, acoustic insulation products, clothing and footwear. More than 1.2 billion pounds of Flexible Polyurethane Foams (FPFs) are produced and used every year in the USA alone [www.p-fa.org]. FPFs are lightweight, durable materials, which density, elasticity and design can be accurately tuned.

The polyurethane foams are produced from a two-part mixture, e.g. those provided by Smooth-On. They are available in various chemistries resulting in wide range of foam densities. FIG. 2a illustrates a series of FPFs with bulk densities varying from 0.08 to 0.4 g/cm$^3$.

Figure 2B:
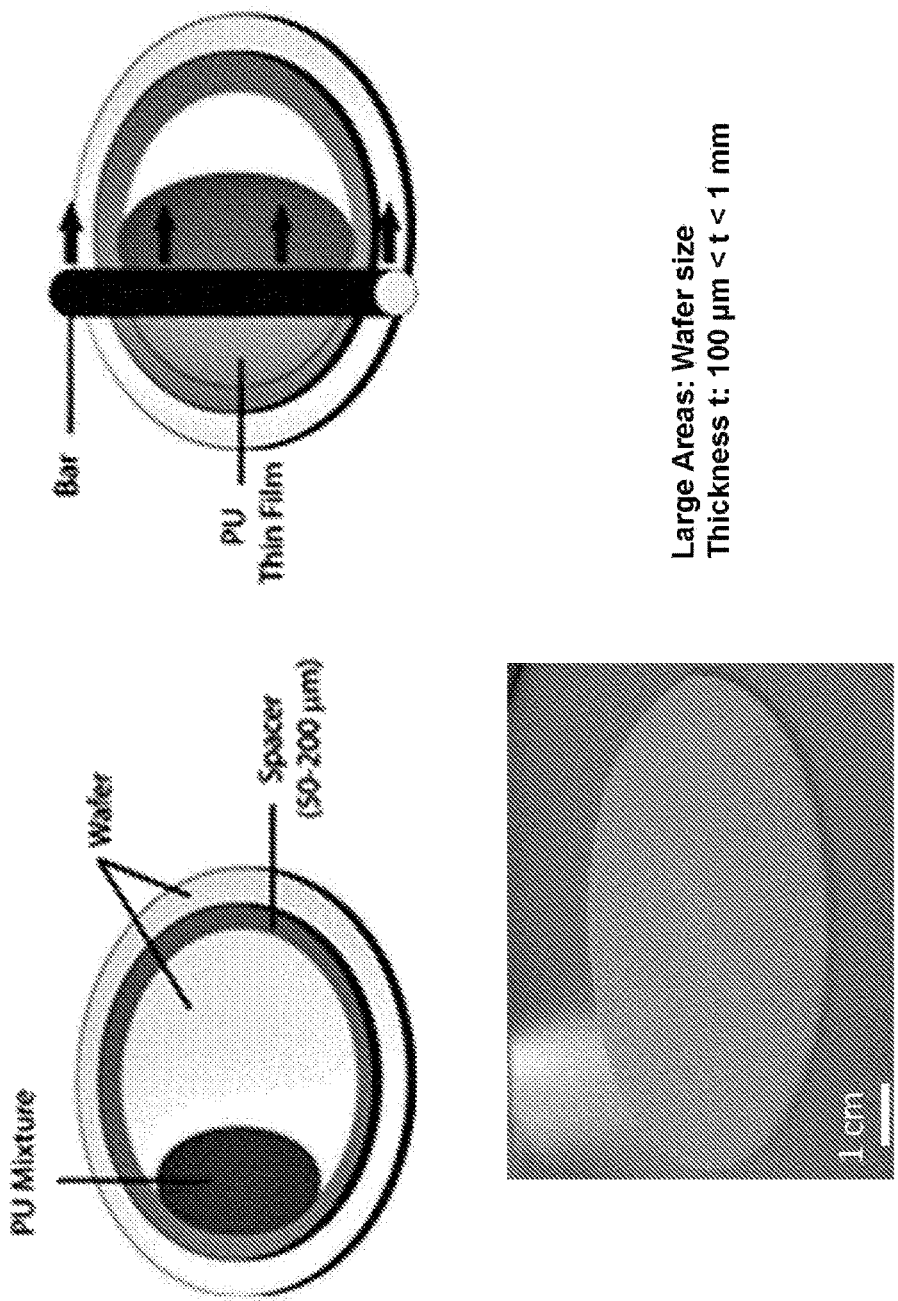
FIG. 2. Flexible polyurethane foams.
a. Density of the polyurethane (PU) foam as a function of chemical composition. Five commercial FPFs are used (Smooth-On, 25, 17, V, X and III). White and grey bars illustrate the measured density and that given by the supplier, respectively. Corresponding pictures of the five FPFs prepared with the same weight of raw material.
b. Schematic illustration of the manufacture of a sub-millimeter thick FPF substrates. A small volume of the raw elastomer mixture is deposited on the edge of rigid carrier, then spread with a bar coater into a uniform film.
Figure 2C:
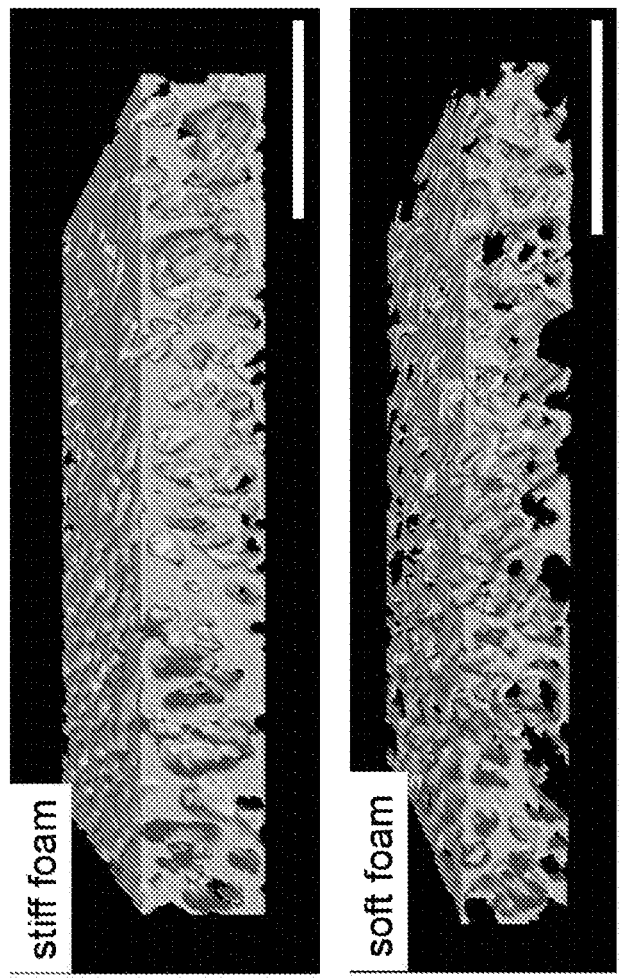

To obtain FPF substrates, the two-part mixture is spread over a glass slab or silicon wafer delineated by spacers of a well-defined thickness (FIG. 2b). For example the foam dielectric was prepared from Smooth-On Flex Foam-iT mixtures, grades III for the softer foam and 17 for the denser foam. The two components are mixed for 30 s at 2000 rpm on an IKA Eurostar upright mixer, then poured onto a silicon wafer overlaid with Kapton (Katco 500 HN) and coated with Ease Release 2831. After 60 s, the mixture is bar-coated under another layer of Ease-Release-coated Kapton 500 HN, spaced with 100 μm-thick ring, and is cross-linked for two hours at room temperature before removing the finished foam. Applying an overpressure on the surface immediately above the polyurethane constraints the vertical expansion of the foam thereby enabling a fine control of the foam substrate. The resulting foams are open-celled foams (FIG. 2c) with densities related but slightly higher than their bulk foam counterparts (prepared with the same chemistry).

Figure 2D:
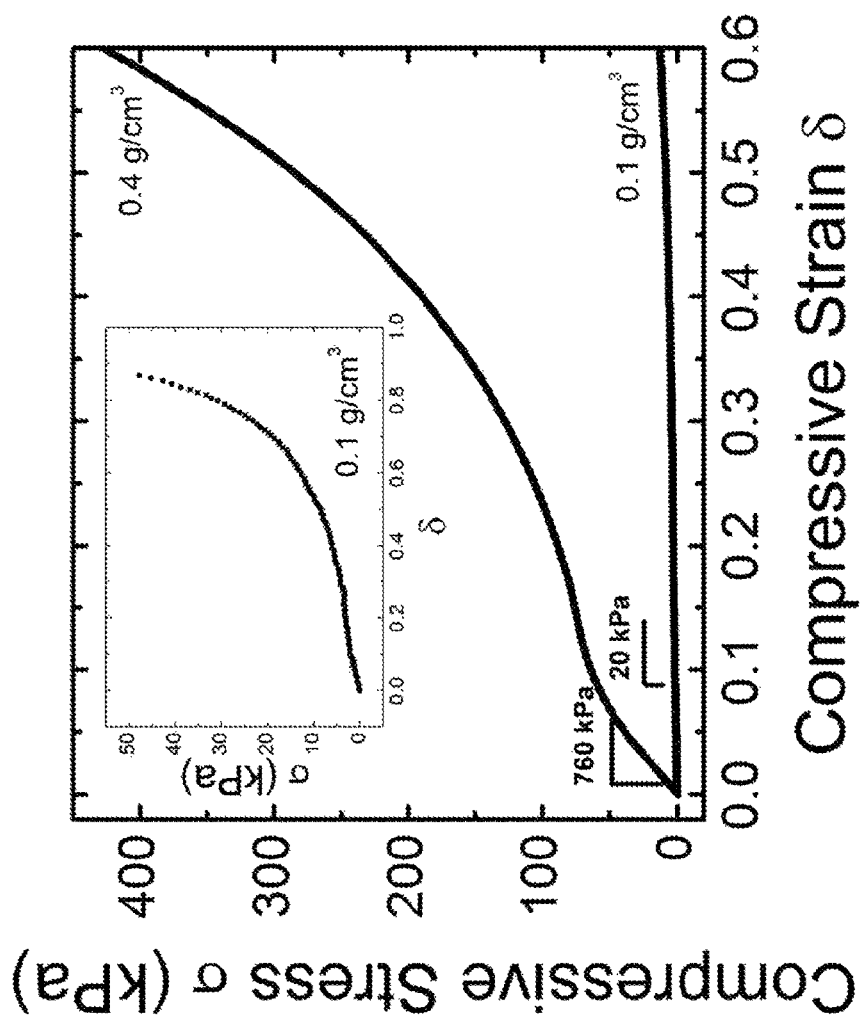
Figure 2E:
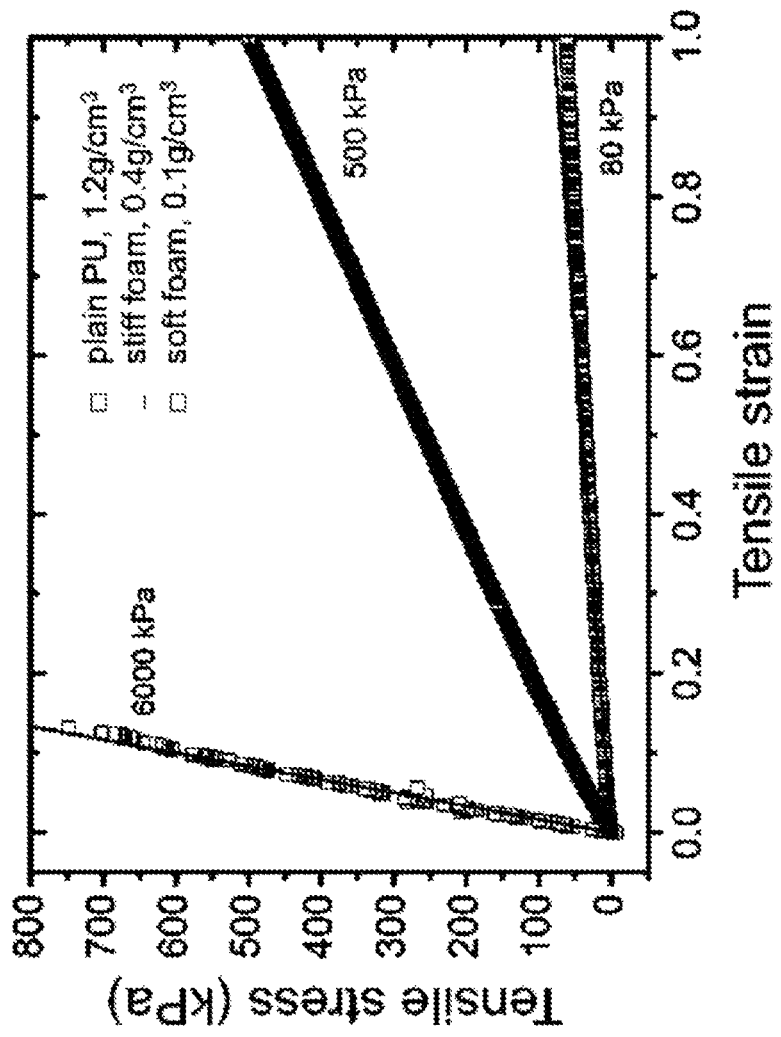

As shown in FIG. 2d-e, these FPF substrates exhibit the typical mechanical behavior of elastomeric foams. Under in-plane compression, 3 regimes are observed: bending of the cell (or bubble) walls leads to linear elasticity at small stresses, where the Young's modulus, E* is the initial slope of the stress-strain curve. The long collapse plateau that follows is related to the Elastic buckling of the walls. Finally, at large compressive strains, the stress rises steeply due to densification, i.e. crushing of the opposite walls together. Obviously, a change in the foam density modifies drastically the stress-strain curve (FIG. 2d). Increasing the film density from 0.1 to 0.33 g/cm$^3$ increases the initial slope (E*) from 18 to 1000 kPa, increases the plateau stress and finally reduces the strain at which densification starts. In contrast, under tensile strength (FIG. 2e), only two regimes take place: first, a linear elastic regime is observed, similarly to that in the compressive loading; then, at higher strains, cell walls twisting leads to a non-linear behavior. The Young's modulus anisotropy in the early stages of both tensile and compression strains are related to the structural anisotropy of the foam.

Strain Localization on the Gold-Capped Foam

FIG. 3a shows a schematic illustration of a gold thin film deposited on top of a plain elastomer substrate and an heterogeneous substrate. FIG. 3b shows scanning electron micrographs (SEM) of a 25 nm thick gold film evaporated on a plain PU elastomer (ρ=1.2 g·cm$^{-3}$) and on a microcellular PU foam (ρ=0.1 g·cm$^{-3}$), held at an applied strain of 20% and 50%.

After deposition, the morphology and topography of the gold thin film on FPF substrate is uniform across the film surface. Upon stretching (applied strain=20%), the gold film immediately above the large cells (~200 μm diameter on the surface) fractures into ~30 μm long cracks perpendicular to the stretch direction. After a 50% strain stretch cycle, the film above the same cells forms a large fold covered with now wide-open ~30 μm long cracks (FIG. 3a—right). The Scanning Electron Microscopy images shown FIG. 3 clearly illustrate the strain distribution and localization (FIG. 3b) above the soft cells in the metal film.

Figure 3C:
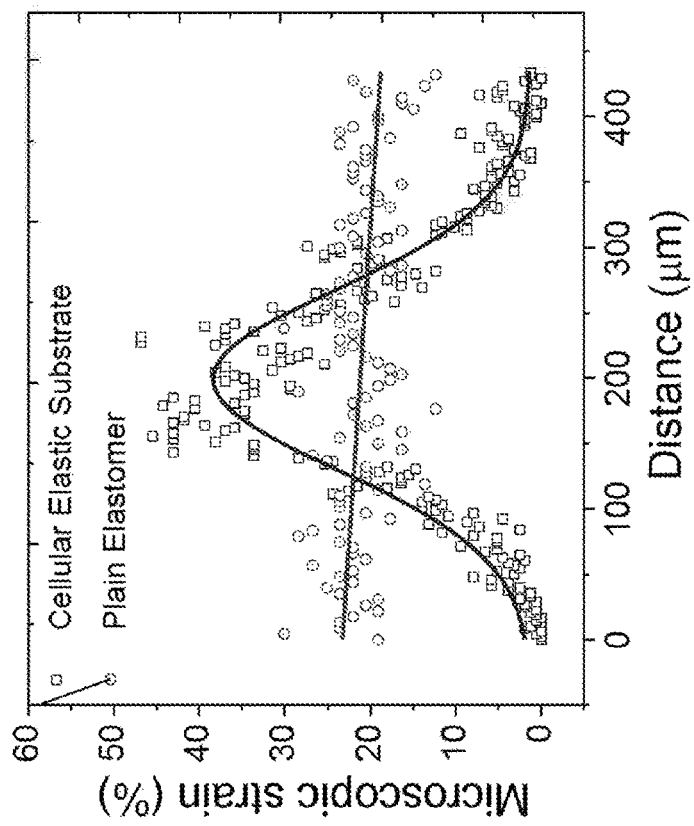

When the metal film on a plain elastomer is stretched, the film forms a uniform distribution of cracks perpendicular to the stretching direction, and wrinkles normal to the cracks (FIG. 3b). The wrinkles parallel to the tensile axis arise from Poisson compression. When the metal film on an elastomer foam is stretched, however, a non-uniform pattern of cracks and folds develops. Cracks and folds form in the gold film above the large cells, leaving other regions of the gold film crack-free and wrinkle-free. The spacing between the cracks, $\lambda_{crack}$, is smaller than the spacing of the cracks in the gold film on the plain PU substrate, while the width of the individual cracks, $w_{crack}$, is smaller. FIG. 3c displays the local strain in the gold film on the plain PU and the local strain in the gold film above one cell on the foam. The local strain is extrapolated from the crack distribution in scanning electronic microscopy SEM images. At $\in_{appl}$=20%, the local strain in the metal film on the plain PU is uniform and equal to $\in_{appl}$. On the PU foam, the strain above the cell peaks to nearly twice the applied strain, and remains close to 0% in between the cells. Furthermore, instead of releasing the Poisson compression by forming periodic wrinkles, the film develops large folds, constrained above the cells (FIG. 3b). Larger applied strain forces these wrinkles merge into a single fold (FIG. 3b), while the surrounding gold film is intact.

Using Differential Interference Contrast Correlation microscopy, a quantitative analysis of the strain and crack distribution above the soft cell is performed (the density of cracks is monitored as a function of applied strain) clearly highlights a peak, maximal, strain at the center of the cell, which reaches nearly 40%, i.e. twice the applied strain. The strain in the metal film outside/surrounding the cells remains close to 0%. Furthermore, at higher applied strains, e.g. 50%, a second instability occurs above the cells: folding. The high tensile strain concentrated above the cells leads to a strong compressive stress in the transversal direction, which forces the gold film to relax by forming a fold immediately above the cell (FIG. 3a—right).

Strain maps of the foam surface are obtained using a video extensometer. Peak strain zones above the cells are clearly visible FIG. 4. We model the cells and their packing with a hexagonal arrangement, and define four regions at the surface of the foam: zone A highlights V-shaped stripes above the cell walls oriented at a 60° angle to $\in_{appl}$ direction; zone B corresponds to stripes above the cell walls parallel to $\in_{appl}$ direction; zone C is the area above the cell, delimited by and normal to zones B; and zone D is the remaining area. The strain in each zone (averaged from the stain maps) is plotted FIG. 4 as a function of $\in_{appl}$. The strain along the cell walls (zones A & B) is significantly lower than that above the cell (zones C & D) and than $\in_{appl}$. The data show a more pronounced strain anisotropy in the soft foam than in the stiff foam.

This unique phenomenon of strain localization in the metal thin film on soft heterogeneous substrate allows the metal thin film to be little affected by the large mechanical loading. Indeed the gold film running in-between the cells remains intact (macroscopically crack-free) even after several cycles to tens of percent strain.

Figure 5A:
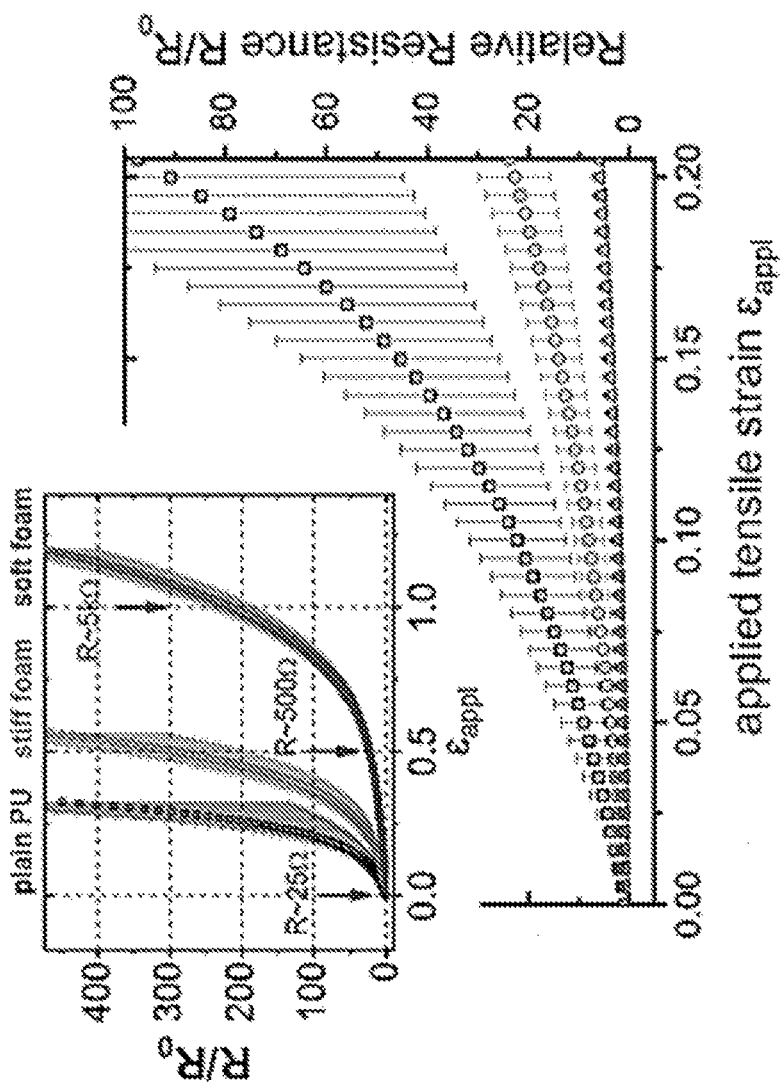
Figure 5B:
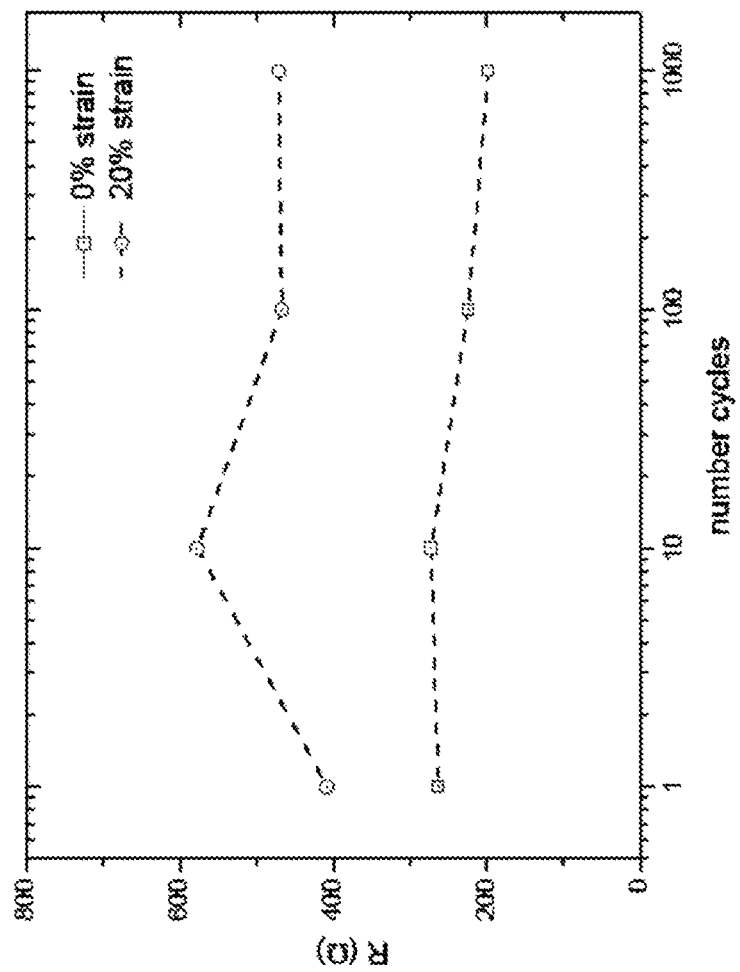
Figure 5C:
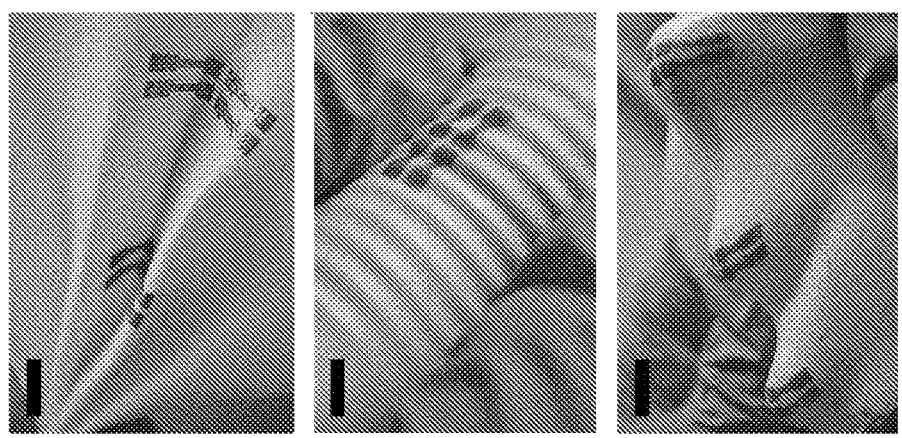

Electrically, the metal film on soft heterogeneous substrate remains functional and displays finite and repeated electrical resistance throughout the stretch cycles. The heterogeneous elastic substrates are used to produce highly stretchable thin metal film conductors. FIG. 5a summarizes the electromechanical response of gold film stripes patterned on plain PU, stiff and soft PU foam substrates. All foam samples exhibit large stretchability and conformability, and can sustain repeated mechanical loading. The electrical resistance of the stretchable conductors as a function of the number of stretch cycles is presented FIG. 5b. The sample's electrical resistance is recorded at 0% applied strain immediately after a cycle, and at 20% applied strain. Resistance values are very stable over the 1,000 cycles. All foam samples exhibit large stretchability and conformability (FIG. 5c) and can sustain repeated mechanical loading. The conductors' maximum elongation $\in_{max}$ (defined when the relative change in resistance is larger than 500) improves with the relative softness of the substrate: $\in_{max,\ plain}=25\% <\in_{max,stiff}=55\%<\in_{max,soft}=120\%$. Furthermore the relative change in resistance is minimal when the metal film is deposited on the softest foam. For a given $\in_{appl}$, the large strain fields above the cells induce catastrophic cracking and folds in the gold film but at the same time prevent or delay any cracking in the surrounding gold ligaments, which allows for a stable percolating path thus continuous electrical conduction.

Figure 5D:
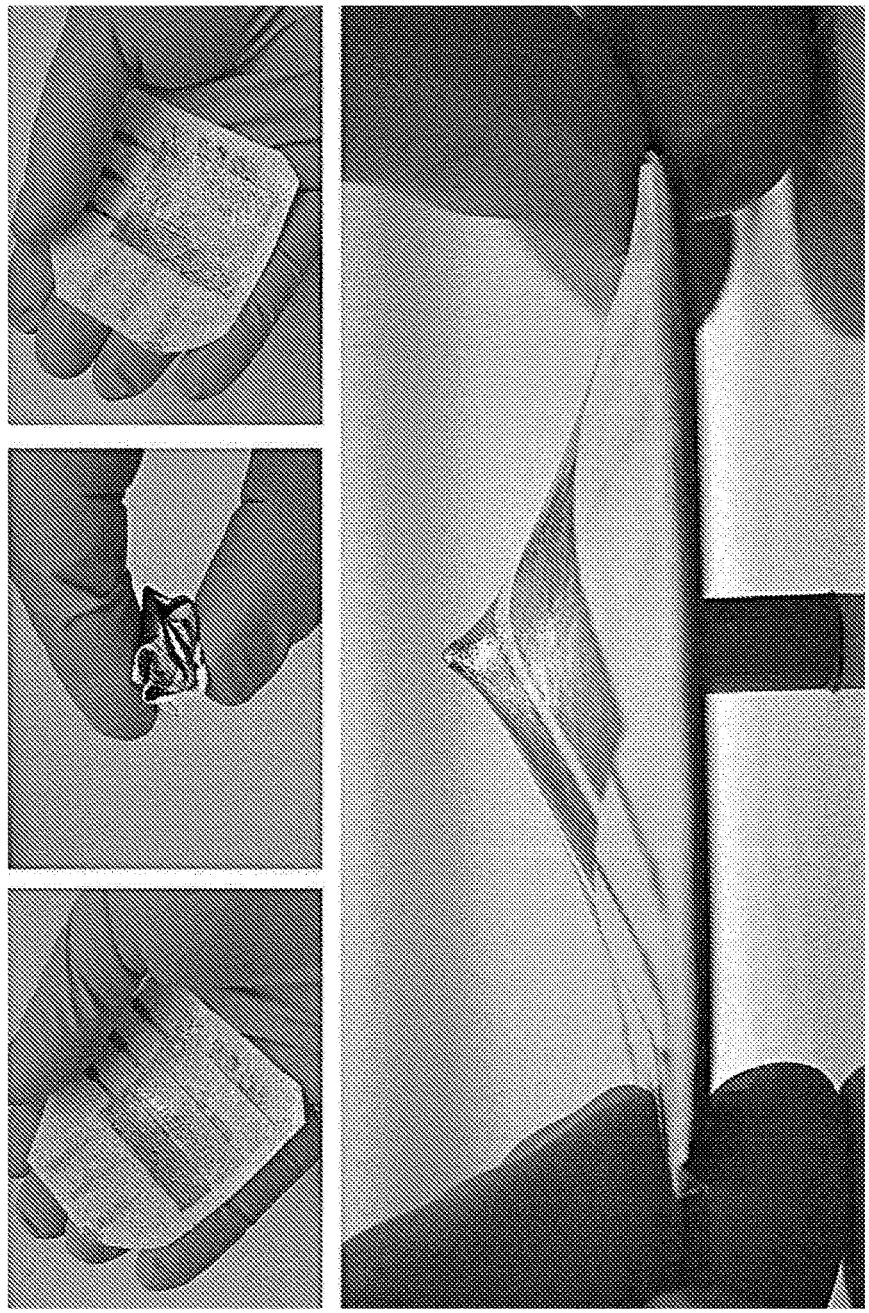

Finally, the FPF coated with gold thin-film are very robust: the gold film withstands the scotch-tape test for adhesion, crumpling, folding, and autoclaving (120 C, 1 atm, water vapor) as shown FIG. 5d. The electrical conductivity of the gold film on soft foam after such treatments remains stable.

Application to Highly Conformal Capacitive Pressure Sensors

Figure 6A:
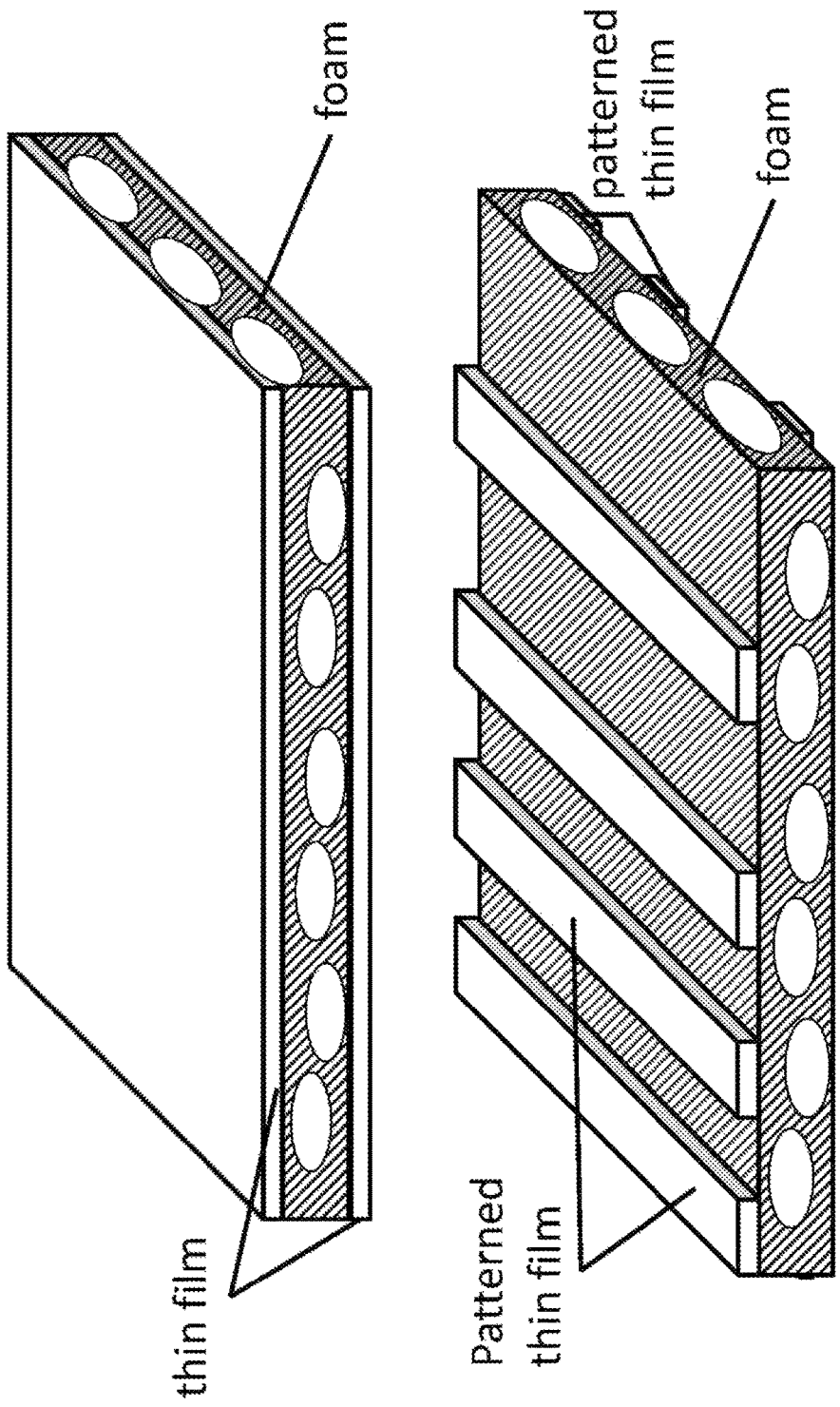

An application of the present invention is in highly compliant pressure sensors. An FPF sandwiched between two thin metal films forms a capacitance. Strain and pressure are detected through the change in the plate capacitance, which depends on the device dimensions, distance between the overlapping metallic electrodes and the dielectric constant of the medium in-between the electrodes. FIG. 6a presents a sketch of foam-based capacitive sensors. The sensor is prepared with a <1 mm dielectric FPF substrate, sandwiched between two 25 nm thick gold electrodes.

Figure 6B:
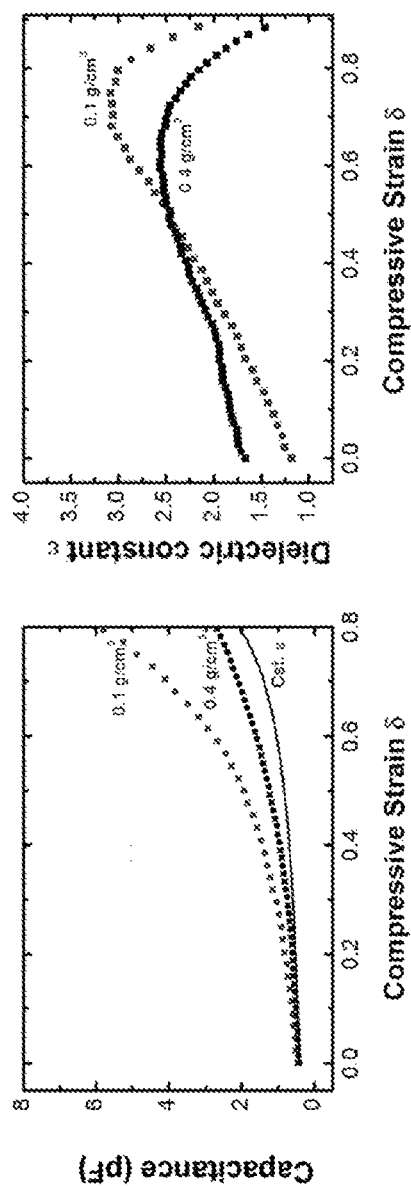
Figure 6C:
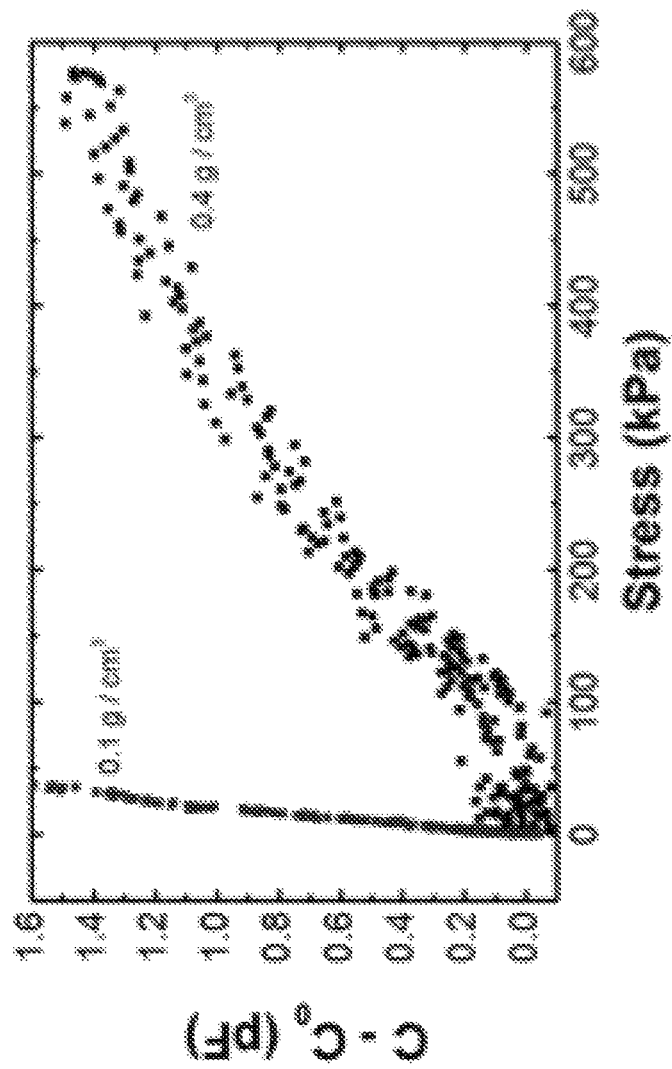
Figure 6D:
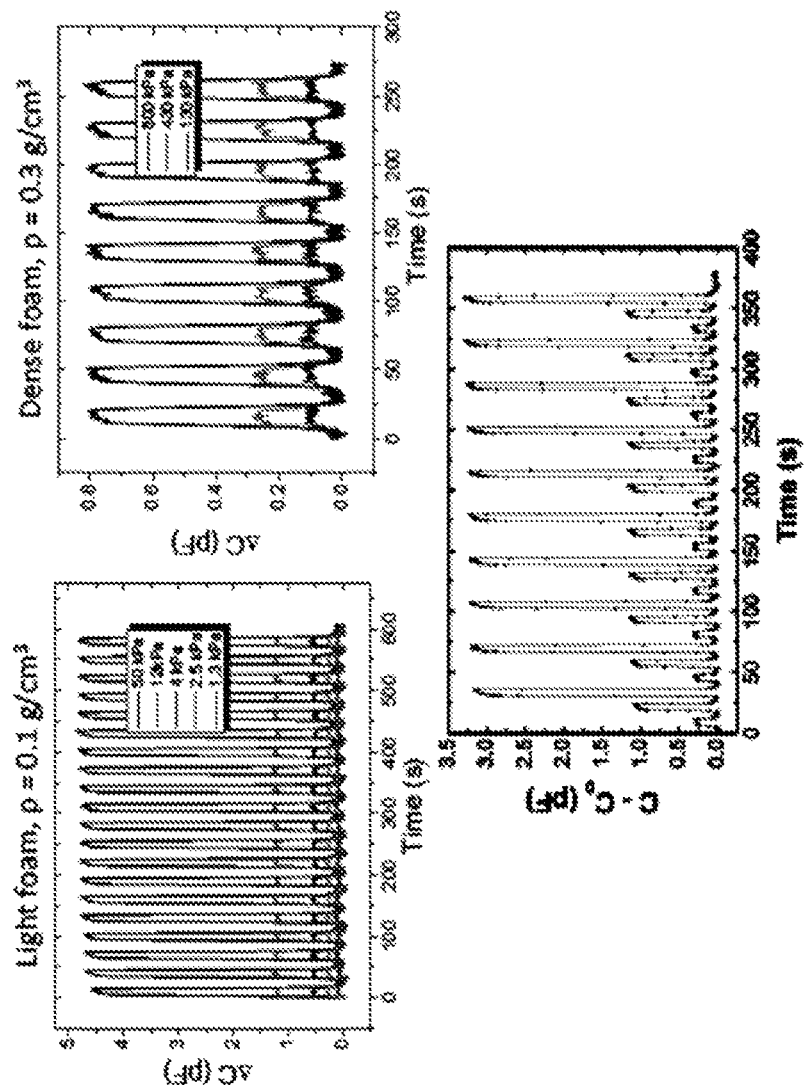

When a pressure (P) is applied normal to the sensor surface, the foam is compressed, the gap between the two electrodes is reduced and the sensor capacitance is increased. The following data are obtained for ~1 cm² surface area sensors. FIG. 6b illustrates the electromechanical response of Au-FPF-Au capacitive sensors. By adjusting the FPF density, one can select the sensitivity of the sensor to a broad range of applied pressure. The sensor prepared with the soft foam can detect pressures as low as 1 kPa (FIG. 6c, top left) with a sensitivity of 0.1 kPa$^{-1}$; pressure and sensitivity range close to those of mechanoreceptors in human skin. Increasing the density of the dielectric FPF allows monitoring a higher range of applied pressure, up to 1 MPa (FIG. 6c, top right). The sensor time response is not significantly affected by the dense FPF.

FIG. 6c—bottom reports the sensor response (prepared with the soft foam) to cyclic compression at three successive stress levels of 10, 50, and 300 kPa; the sensor repeatibly reads the same change in capacity, and detects the smallest indent only five seconds after release of the largest.

FIG. 7 displays the response of the sensors upon a range of mechanical loading, e.g. stretching, crumpling, and autoclave. In FIG. 7a, the variation in capacity of the sensor made on soft foam is measured as the matrix is stretched over a pencil tip. In FIG. 7b, a soft-foam-based sensor is subjected to cyclic compressive strain up to 75% before and after durability tests. Neither the scotch tape test nor crumpling deteriorate performance. Autoclaving does modify the response, but does not cancel it. When wrapped around a golf ball (FIG. 7c-d) the foam conforms to the dimples, and the sensors respond the same as a flat sensor when subjected to 75% compressive strain cycles.

Further Examples of Applications of Metallized FPF

In the Daily life
Mattress, sofa cushion
Vehicle seats
Medical bedding
Lining
Sport items
Running shoes
Ski boots
Skates
Clothing
In the MedTEch field:
Wound care/skin graft
Negative pressure wound healing is a well known technique monitor skin graft healing. It requires a uniform pressure applied uniformly across the wound surface area.
Dry skin electrodes The invention is of course not limited to the examples previously presented but covers any structure defined in the claims.

The invention claimed is:

1. A stretchable electronic structure comprising:
an intrinsically fragile thin film; and
a soft heterogeneous substrate, the intrinsically fragile thin film in contact with the soft heterogeneous substrate,
wherein the soft heterogeneous substrate includes a soft domain of a first constituent or phase surrounded by a continuous stiff domain of second constituent or phase, the soft domain is distributed and embedded into the stiff domain.

2. The structure according to claim 1 wherein the thin film is made of a sub-100 nm thick layer deposited by thermal evaporation on the heterogeneous substrate.

3. The structure according to claim 1 wherein the thin film is made of metal such as gold.

4. The structure according to claim 1 wherein the continuous stiff domain of the substrate includes an elastic matrix and the soft domain of the substrate is distributed within the elastic matrix.

5. The structure according to claim 4 wherein the elastic matrix includes a flexible polyurethane foam (FPF).

6. The structure according to claim 1 wherein the continuous stiff domain forms an elastic matrix, and the soft domain forms a porous material with cavities,
wherein the soft domain includes zones that are distributed within and surrounded by the elastic matrix.

7. The structure according to claim 1 wherein the thin film includes a sub-100 nm thick gold thin film.

8. The structure according to claim 1 wherein the soft heterogeneous substrate includes a sub-mm thick flexible polyurethane foam.

9. The structure according to claim 1 wherein the intrinsically fragile thin film is bonded to the soft heterogeneous substrate to form direct connections to both the soft domain and the continuous stiff domain.

10. The structure according to claim 1 wherein the soft domain forms bodies that are distributed throughout a volume that forms the continuous stiff domain.

11. A process for manufacturing a structure as defined in claim 1 comprising the steps of:
preparing a soft multi-domain material, defined by highly contrasted stiffness including the soft domain distributed and embedded in the continuous stiff domain to form the soft heterogeneous substrate; and
bonding the intrinsically fragile thin film to the soft heterogeneous substrate.

12. The process according to claim 11 wherein the soft multi-domain material is flexible polyurethane foam (FPF).

13. A pressure sensor including a stretchable electronic structure, the structure comprising:
   two intrinsically fragile thin films; and
   a soft heterogeneous substrate, the soft heterogeneous substrate sandwiched between the two fragile thin films and in contact with the two intrinsically fragile thin films,
   wherein the substrate includes a soft domain of a first constituent or phase surrounded by a continuous stiff domain of second constituent or phase, and
   wherein the soft domain is distributed and embedded into the stiff domain.

14. The pressure sensor according to claim 13 wherein, the substrate includes flexible polyurethane foam (FPF).

15. The pressure sensor according to claim 13 wherein the intrinsically fragile thin film is bonded to the soft heterogeneous substrate to form direct connections to both the soft domain and the continuous stiff domain.

16. The pressure sensor according to claim 13 wherein the soft domain forms bodies that are distributed throughout a volume that forms the continuous stiff domain.

\* \* \* \* \*